(12) United States Patent
Peczalski et al.

(10) Patent No.: US 7,786,440 B2
(45) Date of Patent: Aug. 31, 2010

(54) NANOWIRE MULTISPECTRAL IMAGING ARRAY

(75) Inventors: Andy M. Peczalski, Eden Prairie, MN (US); Barrett E. Cole, Bloomington, MN (US)

(73) Assignee: Honeywell International Inc., Morristown, NJ (US)

( * ) Notice: Subject to any disclaimer, the term of this patent is extended or adjusted under 35 U.S.C. 154(b) by 158 days.

(21) Appl. No.: 11/977,767

(22) Filed: Oct. 26, 2007

(65) Prior Publication Data

US 2009/0072145 A1    Mar. 19, 2009

Related U.S. Application Data

(60) Provisional application No. 60/972,120, filed on Sep. 13, 2007.

(51) Int. Cl.
*G01J 5/02* (2006.01)
(52) U.S. Cl. ................................. 250/339.02
(58) Field of Classification Search ............. 250/339.02
See application file for complete search history.

(56) References Cited

U.S. PATENT DOCUMENTS

| | | | | |
|---|---|---|---|---|
| 4,584,475 | A | 4/1986 | Lao | 250/332 |
| 4,638,345 | A | 1/1987 | Elabd et al. | 357/24 |
| 5,237,334 | A | 8/1993 | Waters | 343/753 |
| 5,304,803 | A | 4/1994 | Sakaino et al. | 250/332 |
| 5,729,019 | A * | 3/1998 | Krafthefer et al. | 250/353 |
| 6,242,740 | B1 * | 6/2001 | Luukanen et al. | 250/353 |
| 6,310,346 | B1 * | 10/2001 | Boreman et al. | 250/338.4 |
| 6,953,932 | B2 | 10/2005 | Anderson et al. | 250/338.1 |
| 7,199,358 | B2 | 4/2007 | Kim et al. | 250/238 |
| 7,241,998 | B2 | 7/2007 | Vilain | 250/338.1 |
| 2003/0058346 | A1 | 3/2003 | Bechtel et al. | 348/207.99 |
| 2005/0060884 | A1 * | 3/2005 | Okamura et al. | 29/846 |
| 2005/0264454 | A1 | 12/2005 | Kim et al. | 343/701 |
| 2007/0013575 | A1 | 1/2007 | Lee et al. | 342/52 |
| 2007/0029484 | A1 | 2/2007 | Anderson et al. | 250/338.1 |
| 2007/0035294 | A1 | 2/2007 | Peczalski et al. | 324/252 |
| 2007/0069133 | A1 | 3/2007 | DeWames et al. | 250/339.02 |
| 2007/0102398 | A1 | 5/2007 | Stowell et al. | 216/54 |

(Continued)

OTHER PUBLICATIONS

Peterson et al. Nanowire bolometers, Proceedings of SPIE vol. 4855 (Feb. 2003), pp. 201-207.*

(Continued)

*Primary Examiner*—David P Porta
*Assistant Examiner*—Shun Lee
(74) *Attorney, Agent, or Firm*—Kermit D. Lopez; Luis M. Ortiz; Kevin L. Soules

(57) ABSTRACT

A multispectral imaging array system and method of forming the same. A substrate and a group of antennas can be located with respect to one another on the substrate, such that respective gaps are formed between each antenna group and wherein different antenna sizes may be used for different spectral ranges. Additionally, one or more nanowires can be located within one or more gaps among the respective gaps, such that the nanowires in communication with the antennas and the substrate comprise a multispectral imaging system in which the use of the nanowire(s) decreases the thermal time constant and therefore the read out rate from the antennas while decreasing the ambient gas cooling speed relative to the read out rate to increase the manufacturability of the multispectral imaging array system.

20 Claims, 2 Drawing Sheets

U.S. PATENT DOCUMENTS

2007/0194238 A1  8/2007  Ouvrier-Buffet et al. . 250/338.1
2007/0207761 A1  9/2007  LaBerge et al. .......... 455/277.1

OTHER PUBLICATIONS

Far-Infrared Imaging Array for SIRTF; E.T. Young, J.T. Davis, C.L. Thompson, G.H. Rieke, G. Rivlis, R. Schnurr, J. Cadien, L. Davidson, G.S. Winters, K.A. Kormos; Steward Observatory, University of Arizona, Tucson, AZ 85721; Infrared Astronomical Instrumentation; ed A.M. Fowler, Proceedings SPIE, 3354, 57 (1998).

Fabrication of 3D Feed Horn Shape MEMS Antenna Array using MRPBI (Mirror Reflected Parallel Beam Illuminator System with an Ultra Slow-Rotated and Inclined X-Y-Z Stage; J-Y. Park, K-T. Kim, S. Moon, J.J. Pak; Mat. Res. Soc. Symp. Proc. vol. 687, 2002 Materials Research Society.

Grossman, E.N. et al, "Holographic microantenna array metrology," *Proc. of SPIE* (2005) 5789:44.

Hehini, M., "Microbolometers offer high resolution at room temperature," *Opto & Laser Europe* (2001) Analysis, May 1.

Neikirk, D. P. et al., "Far-Infrared Microbolometer Detectors," *International Journal of Infrared and Millimeter Waves* (1984) 5:245-277 (Abstract).

\* cited by examiner

NANOWIRE MULTISPECTRAL IMAGING ARRAY

CROSS-REFERENCE TO PROVISIONAL PATENT APPLICATION

This application claims the benefit of U.S. Provisional Patent application Ser. No. 60/972,120, entitled "Nanowire Multispectral Imaging Array", which was filed on Sep. 13, 2007.

TECHNICAL FIELD

Embodiments are generally related to imaging arrays and infrared detectors. Embodiments are also related to microbolometers and imaging systems that employ microbolometer components. Embodiments are also related to nanowires and nanotechnology-based components.

BACKGROUND OF THE INVENTION

Infrared (IR) detectors are often utilized to detect fires, overheating machinery, planes, vehicles, people, and any other objects that emit thermal radiation. Infrared detectors are unaffected by ambient light conditions or particulate matter in the air such as smoke or fog. Thus, infrared detectors have potential use in night vision and when poor vision conditions exist, such as when normal vision is obscured by smoke or fog. IR detectors are also used in non-imaging applications such as radiometers, gas detectors, and other IR sensors. Infrared detectors generally operate by detecting the differences in thermal radiance of various objects in a scene. That difference is converted into an electrical signal which is then processed to produce an output related to temperature differences in a scene.

Some types of Infrared detectors employ what is known in the art as a microbolometer. After fabrication, microbolometers are generally placed in vacuum packages to provide an optimal environment for the sensing device. The quality of the vacuum inside the package greatly affects the sensitivity of the detector, a high vacuum being necessary. Conventional microbolometers measure the change in resistance of a detector element after the microbolometer is exposed to thermal radiation. Microbolometers have applications in gas detectors, night vision, and many other situations.

A "bolometer" operates on the principle that the electrical resistance of the bolometer material changes with respect to the bolometer temperature, which in turn changes in response to the quantity of absorbed incident infrared radiation. These characteristics can be exploited to measure incident infrared radiation on the bolometer by sensing the resulting change in its resistance. When used as an infrared detector, the bolometer is generally thermally isolated from its supporting substrate or surroundings to allow the absorbed incident infrared radiation to generate a temperature change in the bolometer material, and be less affected by substrate temperature. Modern microbolometer structures were developed by the Honeywell Corporation. By way of background, certain prior art detectors and/or arrays, for example those manufactured by Honeywell, Inc., are described in U.S. Pat. Nos. 5,286,976, and 5,300,915, and 5,021,663, each of which is hereby incorporated by reference. Such detectors include those microbolometer detectors that have a two-level microbridge configuration: an upper level and a lower level form a cavity that sensitizes the bolometer to radiation of a particular range of wavelengths; the upper level forms a "microbridge" that includes a thermal sensing element; the lower level includes read-out integrated circuitry, and reflective material to form the cavity; the upper microbridge is supported by legs which thermally isolate the upper level from the lower level and which communicate electrical information therein to the integrated circuitry.

A list of references related to the aforesaid structure may be found in U.S. Pat. No. 5,420,419. The aforesaid patent describes a two-dimensional array of closely spaced microbolometer detectors which are typically fabricated on a monolithic silicon substrate or integrated circuit. Commonly, each of these microbolometer detectors are fabricated on the substrate by way of a commonly referred to "bridge" structure that includes a temperature sensitive resistive element that is substantially thermally isolated from the substrate. This aforesaid microbolometer detector structure is herein referred to as a "thermally-isolated microbolometer." The resistive element may, for example, be comprised of vanadium oxide material that absorbs infrared radiation. The constructed bridge structure provides good thermal isolation between the resistive element of each microbolometer detector and the silicon substrate. An exemplary microbolometer structure may dimensionally be on the order of approximately 50 microns by 50 microns.

In contrast, a microbolometer detector that is fabricated directly on the substrate, without the bridge structure, can be referred to as a "thermally shorted microbolometer," since the temperature of the substrate and/or package will directly affect it. Alternately, it may be regarded as a "heat sunk" microbolometer since it is shorted to the substrate.

Microbolometer detector arrays may be used to sense a focal plane of incident radiation (typically infrared). Each microbolometer detector of an array may absorb any radiation incident thereon, resulting in a corresponding change in its temperature, which results in a corresponding change in its resistance. With each microbolometer functioning as a pixel, a two-dimensional image or picture representation of the incident infrared radiation may be generated by translating the changes in resistance of each microbolometer into a time-multiplexed electrical signal that can be displayed on a monitor or stored in a computer. As used herein, the term "pixel" is equivalent to the term "microbolometer". The circuitry used to perform this translation is commonly known as the Read Out Integrated Circuit (ROIC), and is commonly fabricated as an integrated circuit on a silicon substrate. The microbolometer array may then be fabricated on top of the ROIC. The combination of the ROIC and microbolometer array is commonly known as a microbolometer infrared Focal Plane Array (FPA).

Individual microbolometer pixels will have non-uniform responses to uniform incident infrared radiation, even when they are manufactured as part of a single microbolometer FPA. This is due to small variations in the detectors' electrical and thermal properties as a result of the manufacturing process. This non-uniformity in the individual microbolometer response characteristics, commonly referred to as spatial non-uniformity, must be corrected to produce an electrical signal with adequate signal-to-noise ratio for image processing and display. The characteristics contributing to spatial non-uniformity, among others, include the infrared radiation absorption coefficient, resistance, temperature coefficient of resistance (TCR), heat capacity, and thermal conductivity of the individual detectors.

Imaging arrays exist in the infrared spectral range with over 500×500 pixels. The range of the array operation must, however, be extended below the THz region of the spectrum to facilitate new applications (e.g., weapons detection). It has been demonstrated that using a wide spectral range improves the utility of the array for a clearer image, contrast and therefore better probability of detection. In modern systems, the frame rate of the imaging system has to be higher than 10 Hz for most applications and a resolution on the order of 1000× 1000 pixels is desired. Prior art systems and configurations have not effectively achieved this goal.

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is, therefore, one aspect of the present invention to provide for an improved infrared and/or Terahertz detection system and method.

It is another aspect of the present invention to provide for a nanowire multispectral array utilized in infrared and/or Terahertz detection applications.

The aforementioned aspects of the invention and other objectives and advantages can now be achieved as described herein.

A multispectral imaging array system, comprising a substrate and a plurality of antennas located with respect to one another on the substrate, such that a plurality of respective gaps are formed between each antenna among the plurality of antennas, wherein each group of antennas among the plurality of antennas comprises a different antenna size. Additionally, one or more nanowires can be located one or more gaps among the respective gaps, such that the nanowires in communication with the antennas and the substrate comprise a multispectral imaging system in which the use of the nanowire(s) decreases the thermal time constant and therefore the read out rate from the antennas while decreasing the ambient gas cooling speed relative to the read out rate to increase the manufacturability of the multispectral imaging array system.

The disclosed embodiments demonstrate how to obtain the high frame rate for high pixel count by using the nanowires as the microbolometer sensing element. The nanowire allows for using the antennas printed on the same dielectric substrate with the size covering the broad spectral range (e.g. 0.8-54 THz) because it replaces microbridge and can be scaled in length to match the gap between the antennas as it changes for different frequency ranges. Moreover the very small diameter of the nanowire decreases the thermal time constant and therefore increases the read-out rate. At the same time the nanowire small diameter decreases the ambient gas cooling speed relative to the read-out rate in the package which increases the required pressure in the package and therefore makes the vacuum package more manufacturable. The material properties of the nanowire can be selected to provide multiple wires in each sensor and therefore decrease the manufacturing variation of the sensor. The basic difference from the other microbolometer arrays is that the microbridge sensing element is replaced by the nanowire for both resistive and thermo-electric implementations.

In one embodiment, four different antenna sizes can be printed on the same substrate and the nanowires can be placed in the gap between the antennas. There are four antenna sizes because each antenna can be tuned only to a limited bandwidth. The gap size has to be of the order of 1/10 of the wavelength and therefore the nanowire length is smaller for higher frequencies. The manufacturing process consists of printing the antennas on the thin dielectric layer on a ground plane substrate. Then the nanowires are deposited in the gaps between the antennas. It is followed by making local packages over each antenna gap. The package protects the fragile nanowire and creates low enough ambient pressure so the gas cooling time constant is longer than the read-out time constant. The readout electronics may be either made of the nanowires or added to the array later on separate die. The electrical connection and vias between pixels and the electronics are printed.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate at least one embodiment of the present invention and are not intended to limit the scope of the invention.

The embodiments disclosed herein describe how to obtain a high frame rate for a high pixel count by utilizing nanowires as the microbolometer sensing element. The nanowire(s) allows for using antennas printed on the same dielectric substrate with a size covering a range of 0.8-54 THz because it effectively replaces the microbridge and can be scaled in length to match the gap between the antennas. Moreover the very small diameter of the nanowire decreases the thermal time constant and therefore increases the read-out rate.

At the same time, the nanowire small diameter decreases the ambient gas cooling speed relative to the read-out rate in the package which makes the vacuum package more manufacturable. The material properties of the nanowire can be selected to provide multiple wires in each sensor and therefore decrease the manufacturing variation of the sensor. The basic difference from the other microbolometer arrays is that the microbridge sensing element is replaced by the nanowire (s) for both resistive and thermo-electric implementations.

Figure 1:
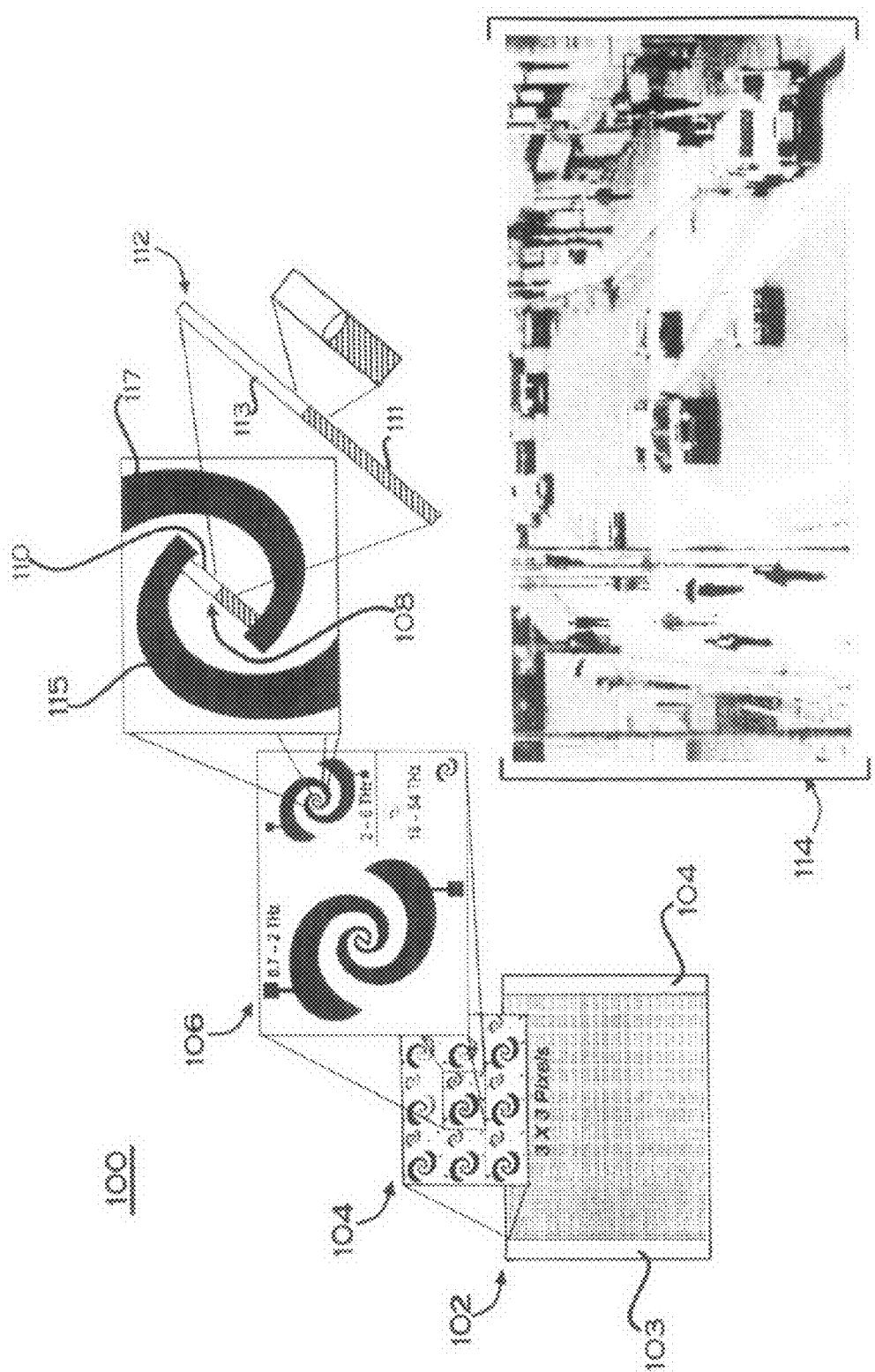
FIG. 1 illustrates a schematic diagram of a nanowire multispectral imaging array system, in accordance with a preferred embodiment.

FIG. 1 illustrates a schematic diagram of a nanowire multispectral imaging array system 100, in accordance with a preferred embodiment. System 100 generally comprises a pixel array 102. In the embodiment depicted in FIG. 1, the pixel array is provided as a 1,000×1,000 pixel array. It can be appreciated, however, that this is merely an illustrative example and that arrays of greater or fewer pixels may be implemented, depending on design considerations. The FIG. 1 illustration shows a 3×3 pixel segment 104 of the overall pixel array 102. Pixel segment 104 is simply a sample of the larger pixel array 102 and could be represented by any 3×3 pixel segment such as for example pixel segment 103. A single example pixel 106 is also shown with respect to the pixel segment 104 and the pixel array 102. A gap 108 between two antennas 115, 117 contains a nanowire bridge 110 is also illustrated in FIG. 1 with respect to every antenna pair in the pixel 106. In the example depicted in FIG. 1, the nanowire bridge 110 can be composed of, for example, 2-6 parallel nanowires 112 with, for example, a diameter of 20 nm. The nanowire 112 can be composed of a Pt section 111 and an Au-Ni section 113 for a thermoelectric readout of Pt or for a thermoresistive readout.

System 100 thus includes four different antenna sizes printed on the same substrate and nanowires are placed in the gap between the antennas. There are four antenna sizes because each antenna can be tuned only to a limited bandwidth. The gap size is preferably on the order of 1/10 of the wavelength and therefore the nanowire length is smaller for higher frequencies. A pictorial representation 114 of system 100 is also illustrated in FIG. 1.

Figure 2:
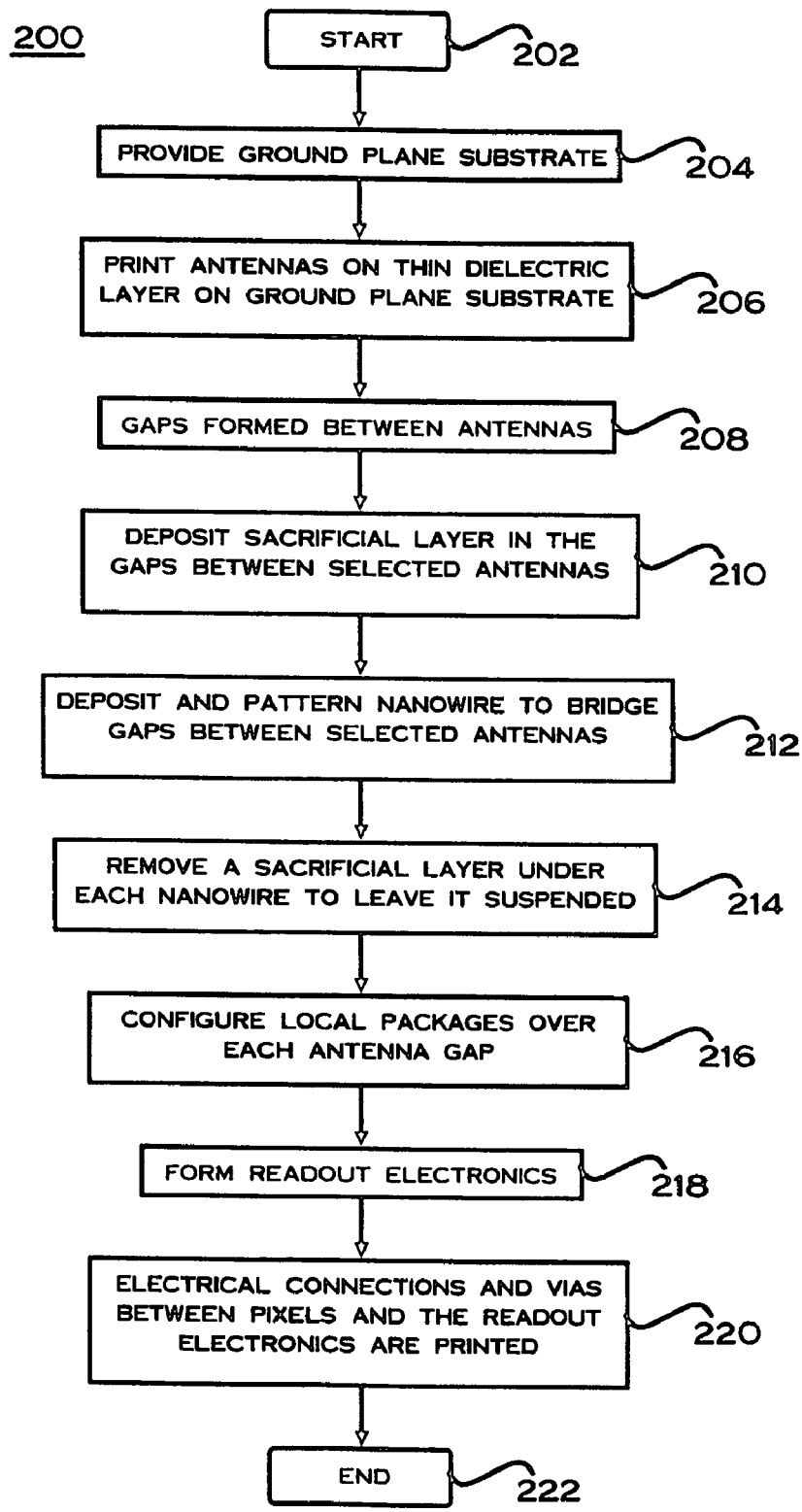
FIG. 2 illustrates a high-level flow chart of operations depicting operational steps for forming a nanowire multispectral imaging array system in accordance with a preferred embodiment.

FIG. 2 illustrates a high-level flow chart of operations depicting operational steps of a method 200 for forming a nanowire multispectral imaging array system in accordance with a preferred embodiment. The method 200 can be implemented for configuring the system 100 depicted in FIG. 1. The illustration of FIG. 1 depicted four different antenna sizes printed on the same substrate and nanowires placed in the gap between the antennas. Note that although found antenna sizes are discussed with respect to the configuration illustrated in FIG. 1, the number "four" is merely an illustrated example. Additional or few antenna sizes can also be implemented, depending upon design considerations.

Thus, the process begins, as illustrated at block 202. Thereafter, as indicated at block 204, a ground plane substrate can be provided. Next, as indicated at block 206, the antennas can be printed on a thin dielectric layer on the ground plane substrate. Thereafter, as illustrated at block 208, gaps are formed between the antennas. Next, as depicted at blocks 210, 212, and 214, nanowires can be deposited and patterned over the gaps between selected antennas. The operation illustrated at block 210 involves depositing a sacrificial layer in the gaps between selected antennas. Thereafter, as depicted at block 212, an operation can be processed in which the nanowire(s) is deposited and patterned to bridge gaps between selected antennas. Next, as depicted at block 214, a sacrificial layer can be removed under each nanowire to live it suspended. That is, the sacrificial layer under the nanowires is removed as indicated in step 214 to leave the nanowire suspended over the gap. Thereafter, as depicted at block 216, local packages can be configured over each antenna gap. The package(s) protects the fragile nanowires and creates low enough ambient pressure so the gas cooling time constant is longer than the read-out time constant. Next, as depicted at block 218, the readout electronics may be either made of the nanowires or added to the array later on separate die. Thereafter, as illustrated at block 220, the electrical connection and vias between pixels and the electronics can be printed with respect to the substrate. The process then terminates, as illustrated at block 222.

The method 200 disclosed in FIG. 2 can thus be utilized for forming the multispectral imaging array/system 100 of FIG. 1. At a high level, a substrate is initially provided. A plurality of antennas are then configured and located with respect to one another on the substrate, wherein the plurality of antennas includes a plurality of antenna groups. Respective gaps are formed between each antenna group among the plurality of antennas. One or more nanowires can be then located in at least one gap among the respective gaps, such that one or more of the nanowires can communicate with the antennas and the substrate, thereby providing the multispectral imaging array/system 100. The nanowire(s) decreases the thermal time constant and therefore the read out rate from the plurality of antennas while decreasing the ambient gas cooling speed relative to the read out rate to thereby increase the manufacturability of the multispectral imaging array system. Inherent to method 200 is the step of providing the antennas to comprise antennas of varying antenna sizes and nanowire lengths with respect to the nanowire(s) in order to respond optimally to different spectral ranges. As indicated previously, the nanowire(s) can be configured as a thermoresistive component, and may be configured from at least two different types of materials that allow for thermoelectric sensing.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The embodiments of the invention in which an exlusive property or right is claimed are defined as follows.

The embodiments of the invention in which an exclusive property or right is claimed are defined as follows. Having thus described the invention what is claimed is:

1. A multispectral imaging array system, comprising:
   a substrate;
   a plurality of antennas located with respect to one another on said substrate, such that a plurality of respective gaps is formed between each antenna among said plurality of antennas;
   at least one nanowire located in at least one gap on said substrate among said plurality of respective gaps, wherein said at least one nanowire is in communication with said plurality of antennas and said substrate; and
   a plurality of local packages covering each of said plurality of respective gaps provided to protect said at least one nanowire located in said at least one gap and to provide a low ambient pressure.

2. The system of claim 1 wherein a diameter of said at least one nanowire is 20 nm to allow for a related decrease in a thermal time constant and therefore an increased read out rate from said plurality of antennas while decreasing an ambient gas cooling speed relative to said read out rate to thereby increase the manufacturability of said multispectral imaging array system.

3. The system of claim 1 wherein said plurality of antennas comprises antennas of varying antenna sizes and said plurality of nanowires comprise nanowires of varying lengths wherein said size of said antenna and said length of said nanowire is configured to respond optimally to different spectral ranges.

4. The system of claim 1 wherein said at least one nanowire is thermoresistive.

5. The system of claim 1 wherein said at least one nanowire comprises at least two different types of materials that allow for thermoelectric sensing.

6. The system of claim 1 further comprising a thin dielectric layer located on said substrate, where said plurality of antennas are printed on said thin dielectric layer.

7. The system of claim 1 wherein said substrate comprises a ground plane substrate.

8. The system of claim 1 further comprising:
   a plurality of sensor pixels wherein at least one sensor pixel among said plurality of sensor pixels is composed of said substrate, said plurality of antennas, said at least one nanowire, and at least one package among said plurality of local packages covering said at least one gap; and
   read-out electronics composed of said at least one nanowire located on a same substrate as said sensor pixels.

9. The system of claim 1 further comprising an array composed of said plurality of antennas, said at least one nanowire, said substrate, and at least one package among said plurality of local packages covering said at least one gap.

10. The system of claim 9 wherein said array comprises groups of said plurality of antennas, wherein each one of said groups constitutes one pixel.

11. The system of claim 10 wherein at least one group among a plurality of said groups of said plurality of antennas constitutes a pixel and is formed into a pixel array.

12. A multispectral imaging array system, comprising:
a substrate;
a plurality of antennas located with respect to one another on said substrate, such that a plurality of respective gaps is formed between each antenna among said plurality of antennas;
at least one nanowire located in at least one gap among said plurality of respective gaps, wherein said at least one nanowire in communication said plurality of antennas and said substrate comprise a multispectral imaging system;
a plurality of local packages covering each of said plurality of gaps provided to protect said at least one nanowire located in said gap and to provide a low ambient pressure; and
a pixel array composed of said plurality of antennas, said at least one nanowire, said substrate, and at least one package among said plurality of local packages wherein groups of antennas among said plurality of antennas constitutes pixels of said pixel array.

13. A method of forming a multispectral imaging array, comprising:
providing a substrate;
configuring a plurality of antennas located with respect to one another on said substrate, wherein said plurality of antennas includes a plurality of antenna groups;
forming a plurality of respective gaps between each antenna group among said plurality of antennas;
locating at least one nanowire in at least one gap among said plurality of respective gaps, wherein said at least one nanowire in communication said plurality of antennas and said substrate comprise a multispectral imaging array; and
forming a plurality of local packages covering each of said plurality of gaps provided to protect said at least one nanowire located in said plurality of respective gaps and to provide a low ambient pressure.

14. The method of claim 13 wherein a diameter of said at least one nanowire is approximately 20 nm to allow for a related decrease in a thermal time constant and therefore an increased read out rate from said plurality of antennas while decreasing an ambient gas cooling speed relative to said read out rate to thereby increase the manufacturability of said multispectral imaging array system.

15. The method of claim 13 further comprising providing said plurality of antennas to comprise antennas of varying antenna sizes and providing said at least one nanowire to comprise nanowires of varying lengths wherein said size of said antenna and said length of said nanowire is configured to respond optimally to different spectral ranges.

16. The method of claim 15 further comprising configuring said at least one nanowire as a thermoresistive component.

17. The method of claim 15 configuring said at least one nanowire to comprise at least two different types of materials that allow for thermoelectric sensing.

18. The method of claim 13 further comprising:
locating a thin dielectric layer on said substrate; and
printing said plurality of antennas on said thin dielectric layer.

19. The method of claim 13 further comprising:
providing a plurality of sensor pixels wherein each sensor pixel among said plurality of sensor pixels is composed of at least a portion of said substrate, said plurality antennas, said at least one nanowire, and said plurality of local packages; and
configuring read-out electronics composed of said at least one nanowire; and
locating said read-out electronics on a same substrate as said sensor pixels.

20. The method of claim 13 further comprising configuring an array composed of said plurality of antennas, said at least one nanowire, said substrate, and said plurality of local packages, wherein said array comprises groups of antennas, and wherein each of said groups of antennas constitutes one pixel.

* * * * *